(12) United States Patent
Tsironis

(10) Patent No.: US 9,857,410 B1
(45) Date of Patent: *Jan. 2, 2018

(54) TUNING METHOD FOR HYBRID ACTIVE INJECTION LOAD PULL SYSTEM

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 239 days.

This patent is subject to a terminal disclaimer.

(21) Appl. No.: 14/930,074

(22) Filed: Nov. 2, 2015

(51) Int. Cl.
*G01R 27/28* (2006.01)
*G01R 31/26* (2014.01)
*G01R 1/04* (2006.01)

(52) U.S. Cl.
CPC ....... *G01R 31/2621* (2013.01); *G01R 1/0491* (2013.01); *G01R 27/28* (2013.01)

(58) Field of Classification Search
CPC .... G01R 31/2621; G01R 31/275; H02J 5/005
See application file for complete search history.

(56) References Cited

U.S. PATENT DOCUMENTS

| | | | |
|---|---|---|---|
| 5,276,411 A | 1/1994 | Woodin | |
| 2004/0119481 A1* | 6/2004 | Tsironis | G01R 27/32 324/637 |
| 2010/0151806 A1* | 6/2010 | Firoiu | H04B 1/30 455/192.2 |
| 2011/0204906 A1* | 8/2011 | Tsironis | G01R 29/0878 324/750.01 |

OTHER PUBLICATIONS

"ALPS-308, Active Load Pull System for PCN Applications", Product Note 33, Focus Microwaves Inc., Apr. 1996.
"MPT a universal Multi-Purpose Tuner", Product Note 79, Focus Microwaves Inc., Oct. 2004.
Power Amplifiers by Amplifier Research: http://www.ar-europe.ie/01_rf_amplifiers.php#maincopypl.
Z. Aboush et al., "High power active harmonic load-pull system for characterization of high power 100 Watt transistor", 35th EuMC, Paris, Oct. 2005.
"Cascading Tuners for High-VSWR and Harmonic Load Pull", Maury Microwave Application Note 5C-081, Jan. 2009.
"Hybrid Active and Harmonic Tuning", Application Note 62, Focus Microwaves Inc., Dec. 2011.

* cited by examiner

*Primary Examiner* — Giovanni Astacio-Oquendo
*Assistant Examiner* — Alvaro Fortich

(57) ABSTRACT

A harmonic load pull system uses a number of synchronized signal sources to inject harmonic power into the output of a power transistor. The mismatch between the signal sources and the transistor internal impedance is reduced by using multi-harmonic tuners, which pre-match the impedance of the signal sources to the internal impedance of the transistor at each harmonic frequency independently. Actual tuning is electronic by changing the amplitude and phase of the injected signals. The transmitted and reflected waves are measured and optimized through bi-directional couplers connected between the transistor and the tuner and a wideband harmonic receiver.

12 Claims, 12 Drawing Sheets

Active injection load pull using two sources and harmonic tuner

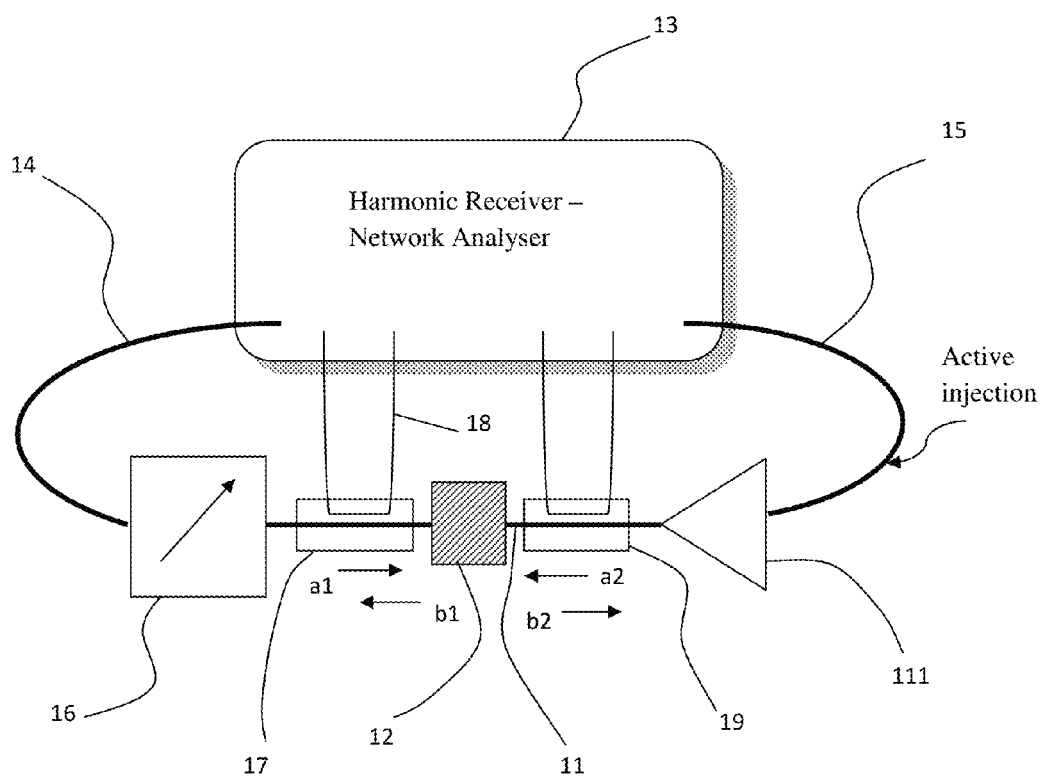
Figure 1: Prior art, active injection load pull

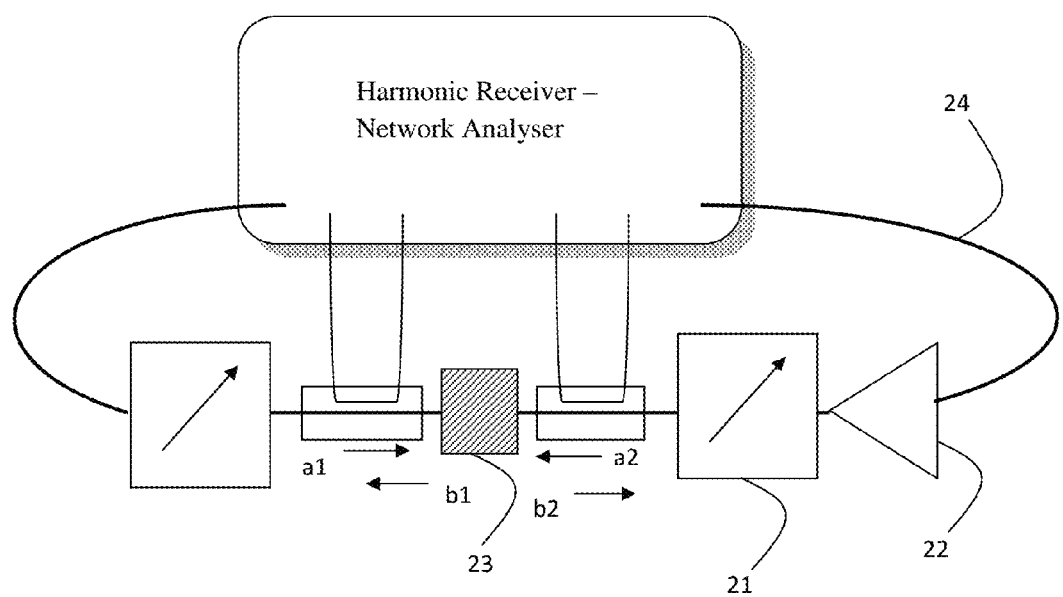
Figure 2: Prior art, active injection load pull using pre-match tuner

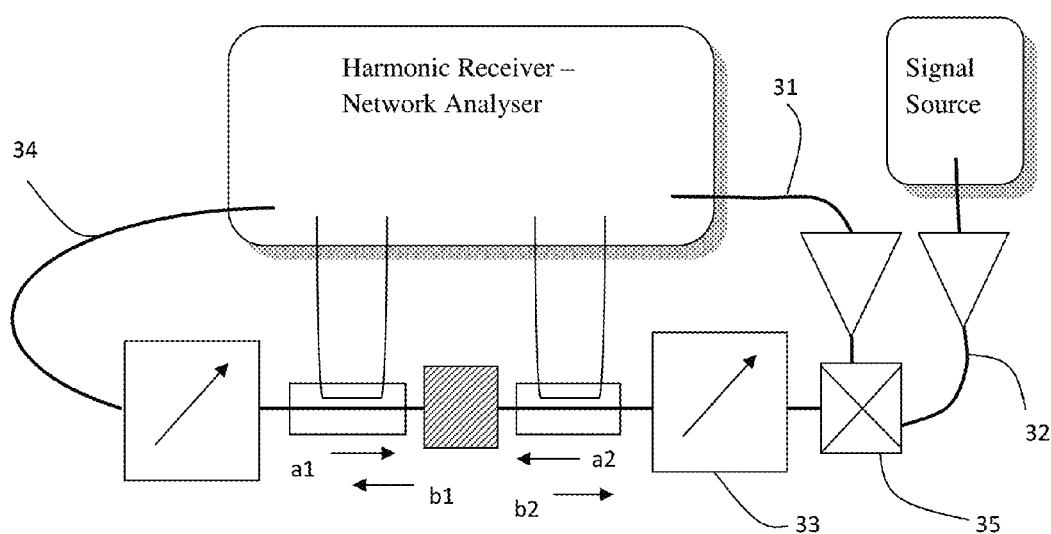
Figure 3: Prior art, active injection load pull using two sources and pre-match tuner

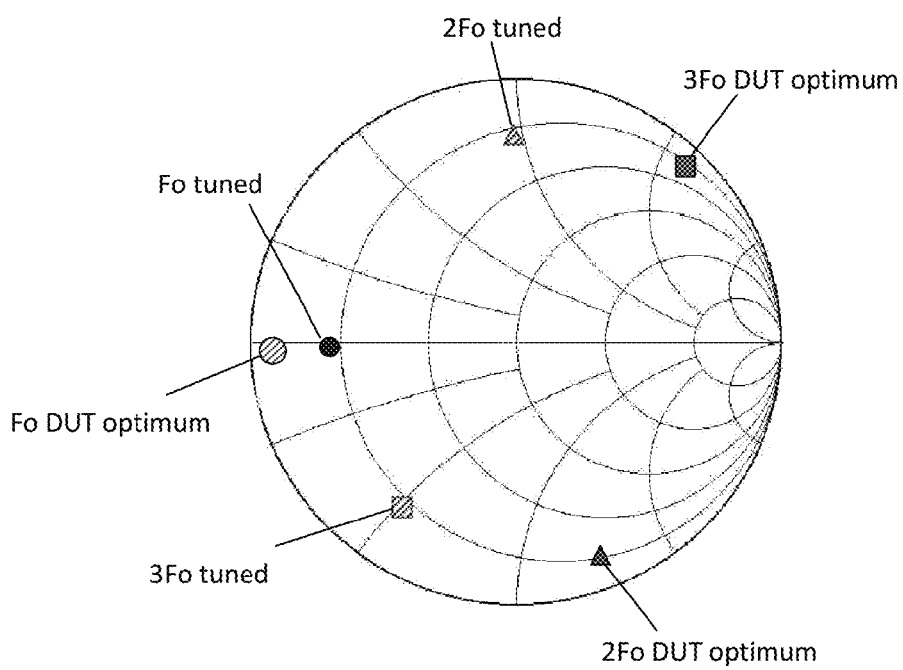
Figure 4: Prior art: harmonic impedances of wideband tuner (tuned for Fo)

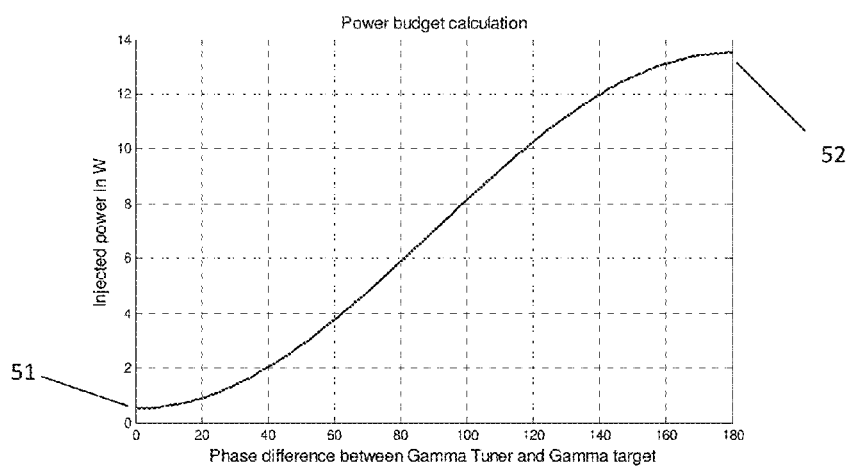
Figure 5: Prior art, power requirement as a function of phase difference between tuned and target points

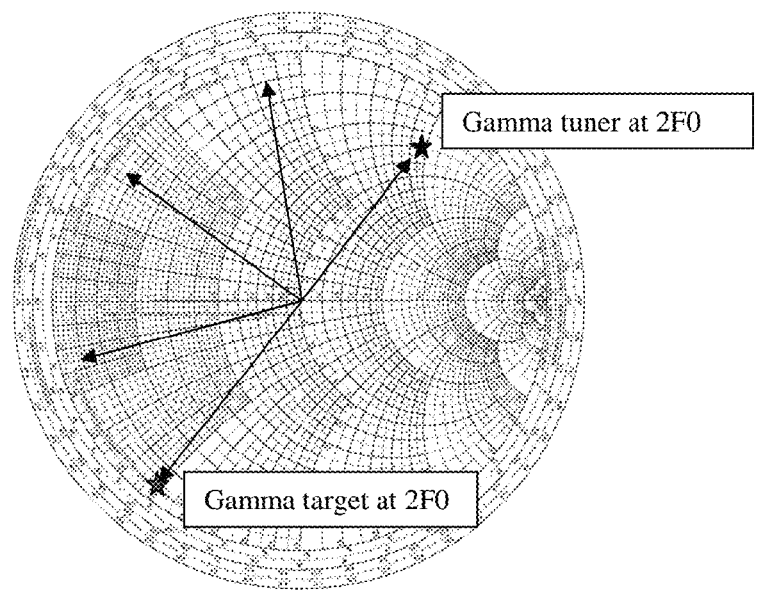
Figure 6: Prior art; mismatch tuning with wideband tuner (possible scenario)

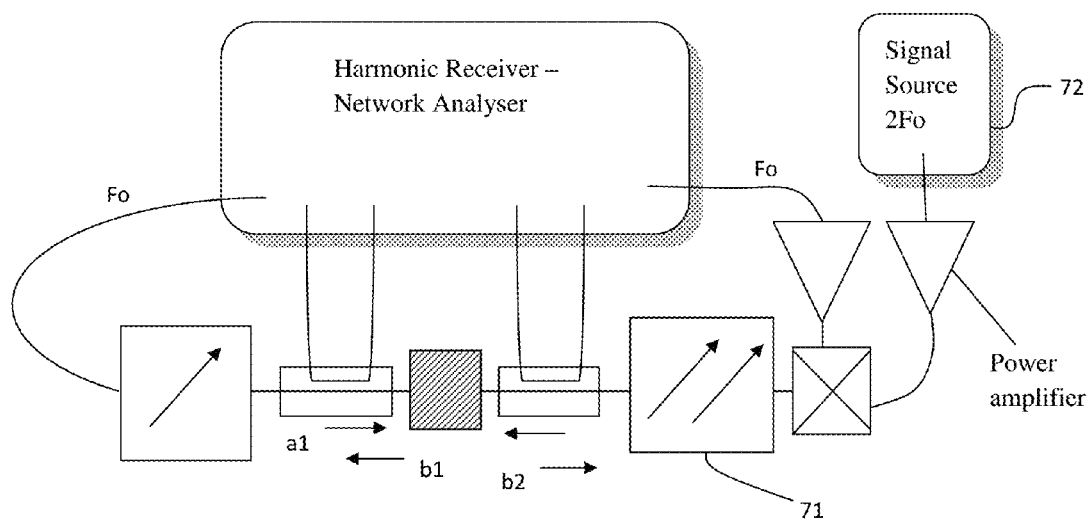
Figure 7: Active injection load pull using two sources and harmonic tuner

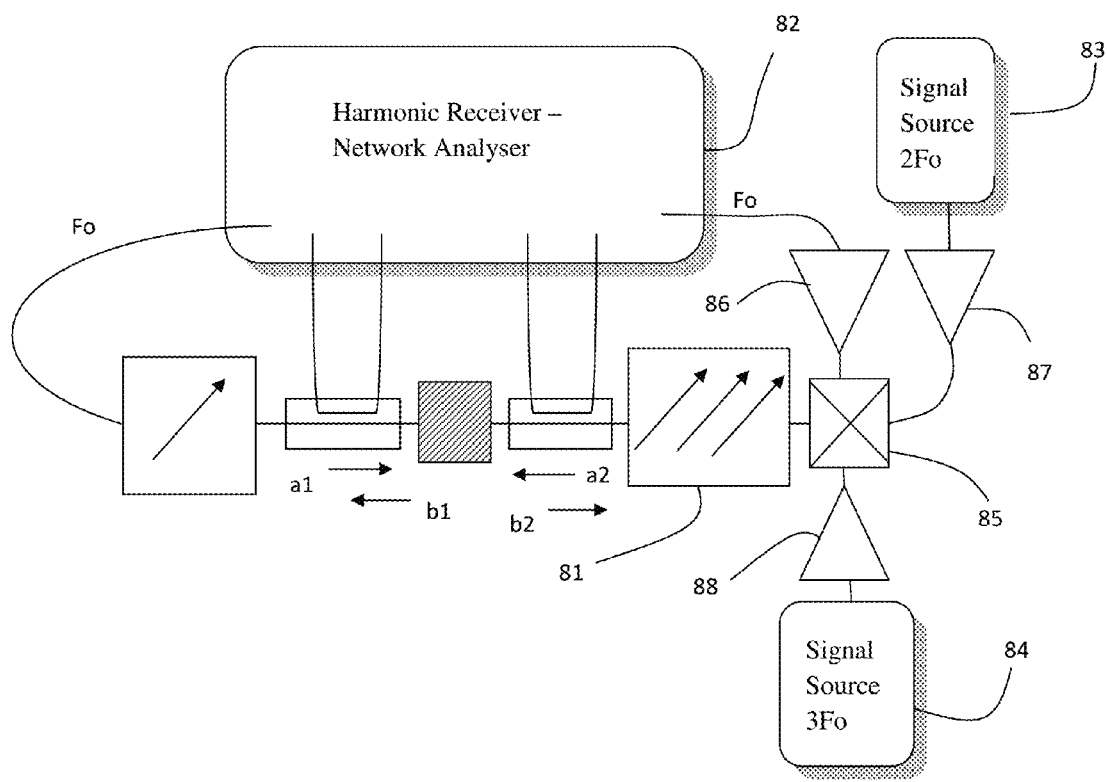
Figure 8: Active injection load pull using three sources and harmonic tuner

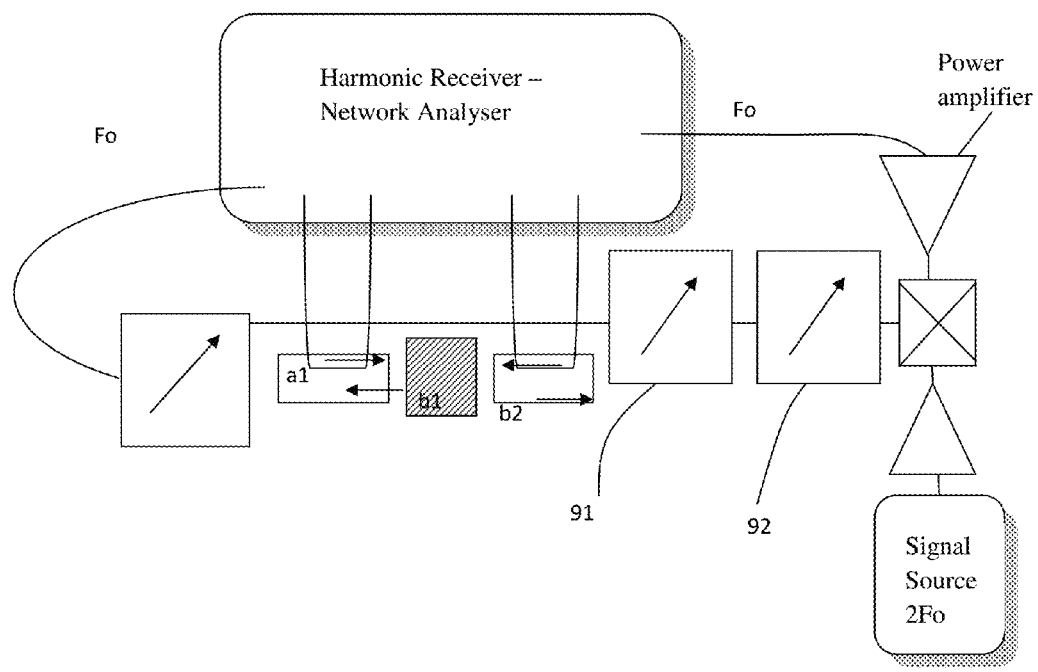
Figure 9: Active injection load pull using two sources and cascade of tuners

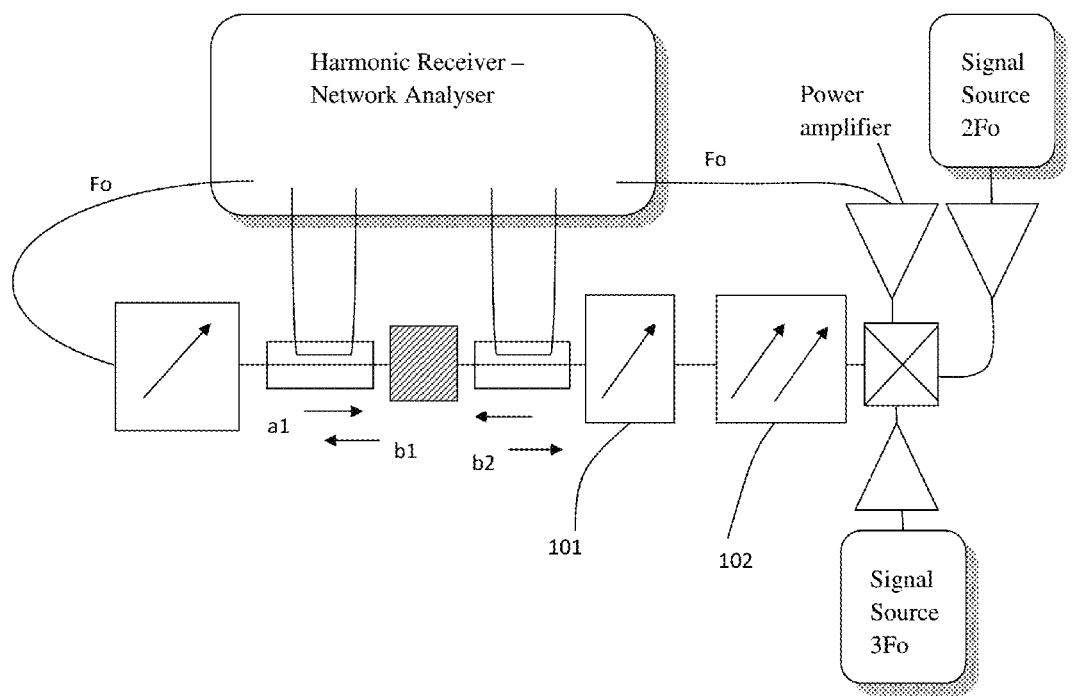
Figure 10: Active injection load pull using three sources and cascade of tuners

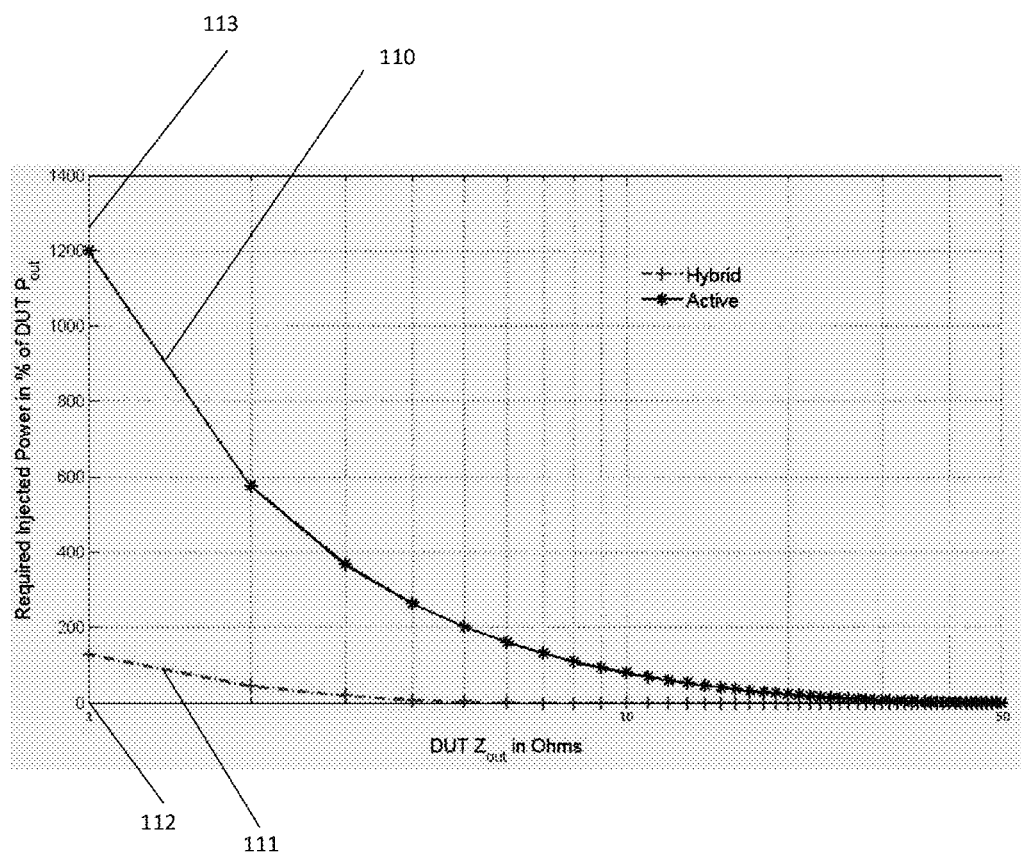
Figure 11: Reduced injection power due to passive pre-matching (hybrid)

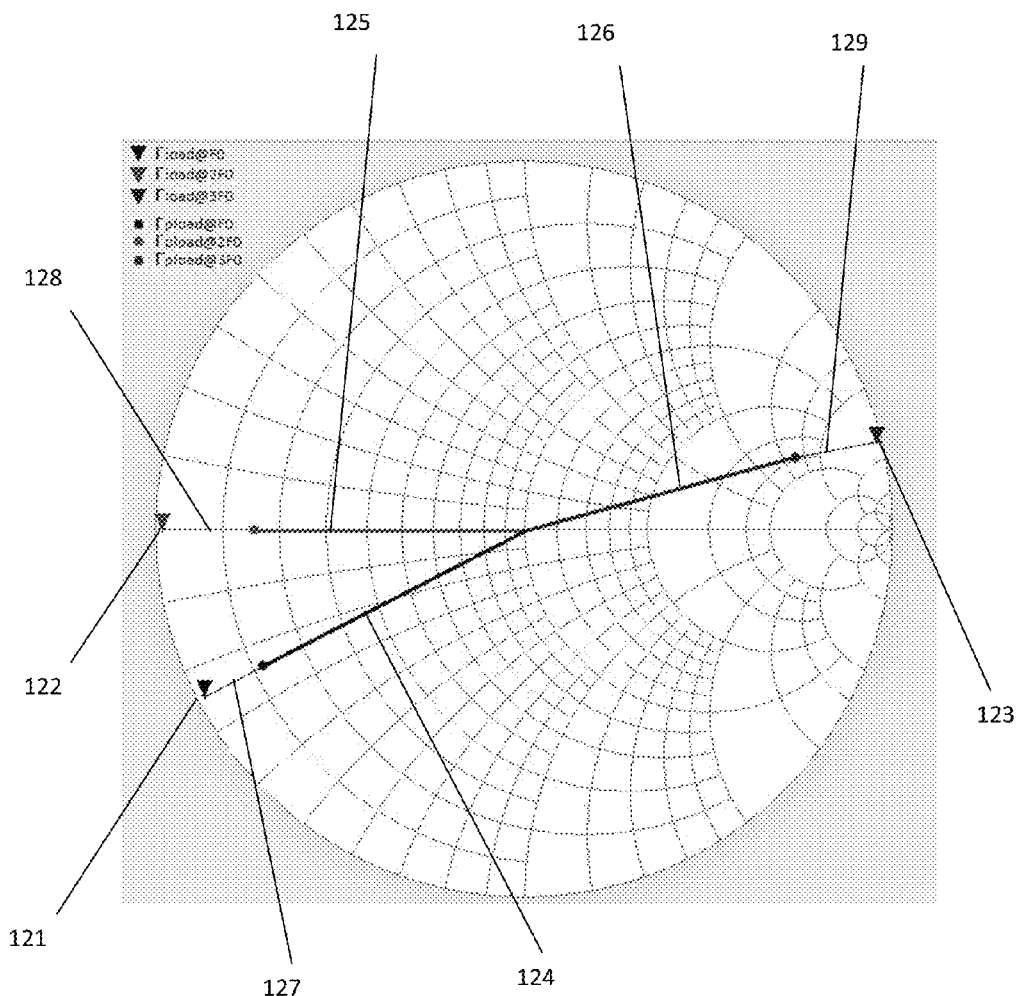
Figure 12: Combination tuning at various harmonic frequencies shown in a Smith chart

TUNING METHOD FOR HYBRID ACTIVE INJECTION LOAD PULL SYSTEM

CROSS REFERENCE

This application is a continuation of U.S. non-provisional patent application Ser. No. 13/904,688, filed on May 29, 2013 and titled "Multi-Source Active Injection Load Pull System and Method", which is incorporated herein by reference in its entirety.

CROSS-REFERENCE TO RELATED ARTICLES

[1] "ALPS-308, Active Load Pull System for PCN Applications", Product Note 33, Focus Microwaves Inc., April 1996.
[2] "MPT a universal Multi-Purpose Tuner", Product Note 79, Focus Microwaves Inc., October 2004.
[3] Power Amplifiers by Amplifier Research: http://www.ar-europe.ie/01_rf_amplifiers.php#maincopypl
[4] Z. ABOUSH et al., "High power active harmonic load-pull system for characterization of high power 100 Watt transistor", 35th EuMC, Paris, October 2005.
[5] "Cascading Tuners For High-VSWR And Harmonic Load Pull", Maury Microwave Application Note 5C-081, January 2009.
[6] "Hybrid Active and Harmonic Tuning", Application Note 62, Focus Microwaves Inc., December 2011.
[7] Woodin, Charles E. U.S. Pat. No. 5,276,411, "High power solid state programmable load".

BACKGROUND OF THE INVENTION—PRIOR ART

RF and Microwave transistor chips are best characterized "on wafer". This allows avoidance of parasitic connection elements, like wire bonds and fringe capacitors, which are associated with packaging the devices in order to mount them in test fixtures. It also allows a much larger number of devices to be tested "in situ" without having to laboriously slice the wafer, mount and wire-bond each individual chip. The "on wafer" testing is at this time the preferred testing method, except for very high power devices, beyond 10 Watt RF power. On-wafer testing is also the exclusive testing method in millimeterwave frequencies, since device packaging is extremely difficult and the parasitic elements associated with the package (inductance of wire bonds and fringe capacitors of package housings) would falsify the measured data to the point of uselessness.

However, on-wafer testing implies reduced tuning range. This is because of the insertion loss of the connection between the tuner and the wafer probes (11) and the insertion loss of the probes themselves (FIG. 1). The DUT, including wafer probes or embedded in a test fixture, is represented schematically in box (12). To compensate for the said insertion loss active load pull has been introduced (see ref. 1). The latest comprehensive active load pull technique is the so called "active injection" load pull (FIG. 1). In this setup a harmonic receiver (13) is used which also provides two or more coherent signal sources (14, 15); coherent means the signals have a fixed controlled phase between them. In this configuration signal (15) being injected into the output (11) of the DUT is at the same frequency and has its phase controlled electronically relative to the phase of signal (14). The signal (14) is injected into the input of the DUT through an (optional) driver amplifier (not shown) and an impedance tuner (16) and an input directional coupler (17). The coupler (17) feeds (18) a small part of the injected (a1) and reflected (b1) signal waves into the harmonic receiver (13). The signal going out of the DUT (11) passes through another directional coupler (19), which also feeds a small part of the injected (a2) and reflected (b2) signal waves into the harmonic receiver (13), and said outgoing signal (11) interacts with the signal injected from the power amplifier (111). Through amplitude and phase control of the injected signal (15) a virtual reflection factor r is generated at the output (11) of the DUT (12): r=a2/b2. Since the amplifier (111) can increase the injected signal amplitude at will, the power returning from the load (a2) can be made larger than the power leaving the DUT (b2). In practical terms this means a reflection factor r>1. This allows matching any internal impedance (reflection factor) of the DUT despite any insertion losses.

The relation between reflection factor and impedance is: $Z=Zo*(1+\Gamma)/(1-\Gamma)$; where Zo is a standard impedance (typically 50 Ohm); this means that for $r=-1$, $Z=0$ Ohm.

The actual problem with this configuration is that there exist, typically, a large impedance mismatch between the output of the power amplifier (111) and the output of the DUT (11). Typical impedances of power transistors (DUT) is 0.5-2 Ohms. Typical impedance of power amplifiers is 50 Ohms. This creates a large mismatch ratio between 25:1 and 100:1. The consequence is that the power required from the amplifier (111) is typically 20 times larger or more than the power generated by the DUT (see ref. 4). This requirement can be reduced if a transformer is used between the DUT (12) and the amplifier (111). This is shown in FIG. 2. The impedance Tuner (21) transforms the (typically) 50 Ohm output impedance of the amplifier (22, 111) closer to the (typically 0.5-2 Ohms) output impedance of the DUT (23). The mismatch reduction (improvement) factor can reach high values, depending on the impedance the tuner (21) can generate and present to the DUT (23). The mismatch factor can be expressed as a "standing wave voltage ratio VSWR"; in a system with a characteristic impedance of 50 Ohm VSWR=50 Q/R.dut, where R.dut is the internal output impedance of the DUT (typically 0.5-2 Ohms). This gives an idea of the actual mismatch: VSWR is between 25 and 100. A transformer (such a tuner) will create, typically, a pre-match factor of the order of 5:1 to 15:1. Knowing that the total mismatch is the product of the partial mismatches, in this case the total mismatch will be reduced by this factor; a 25:1 initial mismatch will be reduced by the said tuner/transformer to values between 5:1 and 1.7:1 (=25/15:1) and an initial mismatch of 100:1 will be reduced to values between 20:1 and 6.7:1. If the tuner can actually reach exactly the conjugate impedance of the DUT (tuner VSWR=DUT VSWR) then no additional signal power (24) will be needed (see ref. 4). If it can only reach values close to the conjugate internal impedance of the DUT then only a reduced signal power (24) is required (see ref. 2). This reduces significantly the complexity and especially the cost of the test setup, since power amplifiers can be expensive.

Harmonic tuning, i.e. independent impedance control at the harmonic frequencies can be materialized using two or more signals (31, 32) injected into a frequency combiner (35) and then into the output of the DUT (FIGS. 3 and 7). These signals must be coherent with the input signal at frequency Fo (34), whereas one signal (31) is at the same, fundamental, frequency (Fo) and the other (32) is typically at the first or even at a higher harmonic frequency (2 Fo or 3 Fo etc. . . . ). The problem with the setup of FIG. 3 is that a wideband impedance tuner (33) is used. A wideband tuner creates reflection over a large frequency range, which, typically, includes the fundamental and several harmonic frequencies. Whereas controllable impedances are created only at one (typically the fundamental, frequency Fo) uncontrollable reflections are created at any other frequency. It may therefore happen that the reflection factors shown to the DUT at a harmonic frequency is slightly or radically different than the internal impedance of the DUT at this frequency (FIG. 4). The dots in FIG. 4 show a scenario where the uncontrollable reflections at the harmonic frequencies (2 Fo and 3 Fo) are anti-diametric (180 degrees off) to the optimum reflection factors of the DUT at said frequencies. This is not the usual scenario, but a possible one, that an efficient test setup should be able to handle routinely.

In FIG. 4 the dot marked "Fo" is noted as "reduced because of coupler loss": this means that a typical setup as discussed here (FIGS. 1, 2, 3) includes directional couplers adjacent to the DUT (17, 19) in order to detect the incident and reflected waves by the receiver (13). In such a case the insertion loss in said couplers will reduce the tuning range of said tuner (21). This explains the markings on "Fo" in FIG. 4.

The effect of harmonic impedance mismatch (FIG. 4) is shown quantitatively in FIGS. 5 and 6: the plot in FIG. 5 represents a calculation of injected power required to match the harmonic impedance of a DUT as a function of the phase mismatch between the reflection factor generated by the wideband tuner (33) and the DUT. The actual numbers shown are for a typical 20 Watt DUT operated at medium compression and generating harmonic power at 2 Fo of 0.4 Watt (P(2 Fo)/P(Fo)=−17 dB). The plot is typical for many practical cases. It shows at point (52) that, if the mismatch angle is 180 degrees the requirement for harmonic injection power increases by a factor of 33.75 (13.5/0.4) relative to the case where proper pre-matching reduces the injection power requirement is minimum or even zero, as shown at point (51). A similar calculation holds for 3 Fo as well. Because harmonic frequencies are high, associated power amplifiers are very expensive (see ref. 3). This is all in addition to any unavoidable connection and adapter losses. Therefore an appropriate means for reducing said power requirement will reduce sensibly the cost of the setup.

DESCRIPTION OF THE DRAWINGS

The disclosed invention will be better understood when viewed together with the enclosed pictures, as follows:

FIG. 1 depicts prior art: the block diagram of an open loop active injection load pull test setup.

FIG. 2 depicts prior art: the block diagram of an open loop active injection load pull test setup using a wideband pre-matching impedance tuner.

FIG. 3 depicts prior art: the block diagram of an open loop active injection load pull test setup using two synchronized sources (typically Fo (fundamental) and 2 Fo (second harmonic)) and a wideband pre-matching impedance tuner.

FIG. 4 depicts prior art: possible distribution of harmonic impedances (reflection factors) of a wideband impedance tuner on a Smith chart and associated optimum impedances to be presented to the DUT, showing possible significant differences.

FIG. 5 depicts prior art: Injection power requirement to match the output impedance of a DUT as a function of the phase difference between DUT (target) and reflection factors created by a wideband tuner (compare with FIG. 4).

FIG. 6 depicts prior art: possible (close to "worst case") tuning mismatch situations when using a wideband impedance tuner.

FIG. 7 depicts an open loop active injection load pull test setup using two synchronized signal sources (typically Fo and 2 Fo) and a two probe two-frequency (harmonic) impedance tuner.

FIG. 8 depicts an open loop active injection load pull test setup using three synchronized signal sources (typically harmonics Fo, 2 Fo, 3 Fo) and a three probe three-frequency (harmonic) impedance tuner.

FIG. 9 depicts an open loop active injection load pull test setup using two synchronized signal sources (typically Fo and 2 Fo) and a cascade of two single probe, wideband impedance tuners.

FIG. 10 depicts an open loop active injection load pull using three synchronized signal sources (typically Fo, 2 Fo and 3 Fo) and a cascade of single and double probe impedance tuners.

FIG. 11 depicts the reduction effect of passive prematching on injection power requirements as a function of the internal impedance of the DUT in a 50 Ohm test system. The vertical axis (113) shows the required injected power (Pinj) as related to the DUT output power (Pout); the scale range is 0 to 1400%.

FIG. 12 depicts the creation of overall reflection factors (121, 122 and 123) at DUT output port as a combination of passive reflection factors (124, 125 and 126) and active, "power-injection created", reflection factors (127, 128 and 129) for three harmonic frequencies (Fo, 2 Fo and 3 Fo); the same scheme is valid for any (not harmonic) frequency as well.

DETAILED DESCRIPTION OF THE INVENTION

The proposed solution serving to reduce the power requirement of the injection amplifiers in open loop harmonic injection load pull test systems is shown in FIGS. 7 to 9 (see ref. 6). Instead of using single carriage wideband tuners (33) another type of impedance tuners are employed, the multi-carriage harmonic tuners (see ref. 2) (71, 81). Harmonic tuners (see ref. 2) operate in such a way as to be able to generate arbitrary impedances Z(Fi) at different frequencies, including harmonic frequencies Fi (Fo, 2 Fo, 3 Fo . . . ), independently on each-other. The harmonic tuners in the setups of FIGS. 7 to 9 allow the pre-matching of the DUT to the load at each harmonic frequency independently and as close as possible to the conjugate complex internal impedance (optimum matching impedance) of said DUT at the specific frequency. This allows operating at point (51) in the diagram of FIG. 5, i.e. with minimum or zero requirement of injected power at the fundamental and any harmonic frequency. It has to be emphasized that the relationship in FIG. 5 is valid for any frequency, including the fundamental (Fo) and all harmonics (2 Fo, 3 Fo, . . . ). Alternatively to single housing harmonic tuners the cascade of two or more wideband tuners can be used to perform harmonic tuning (91, 92), though with less efficiency.

In the setup of FIG. 7 a two-probe two-frequency harmonic tuner (71) is required, since the only controlled second harmonic source is at 2 Fo (72). In this case the impedance at the harmonic frequency 3 Fo is ignored and no power is injected at this frequency. The same setup could be configured to control Fo and 3 Fo and ignore the second harmonic 2 Fo; this depends on the nonlinear mode of operation of the DUT and the actual waveform of voltages and currents through the DUT and the associated Fourier harmonic frequency components.

In FIG. 8 the fundamental (Fo) and two harmonic frequencies (2 Fo, 3 Fo) are processed. The fundamental frequency is injected through the receiver's (VNA's) second internal source (82) the second harmonic through a first external source (83) and the third harmonic (3 Fo) through a second external source (84). All three frequencies are combined through the frequency/power combiner (85) and injected into the multi-probe (harmonic) tuner (81). Said tuner is a three-probe tuner (see ref. 2) which can tune all three frequencies independently, thus reducing the power requirement from the sources (82, 83, 84) and the output power of the associated power amplifiers (86, 87, 88).

A similar configuration as in FIG. 7 occurs if instead of an integrated harmonic tuner (71) a cascade of two wideband tuners (91, 92) is used, as shown in FIG. 9. The tuning principle remains the same (see ref. 5), except for some practical imperfections, such as reduced tuning range and mechanical misalignment.

FIG. 10 shows, again in principle the same configuration as in FIG. 8, where, instead of an integrated three-probe tuner, a cascade of a two-probe harmonic tuner (102) with a single probe wideband tuner (101) is used. Said tuner combination works in a similar way as a three-probe tuner (81) or the equivalent, not shown here, which is the use of a cascade of three wideband tuners.

Electronic (PIN diode based) tuners are passive tuners; they behave similarly to slide-screw electromechanical tuners (see ref. 7); they can replace said electromechanical tuners arranged in cascade in order to create independent impedance control; loss of said tuners is higher than of electro-mechanical tuners, therefore their employment, despite lower size and weight, is not favorable; however they do represent a technically possible alternative.

All mismatch reduction and power saving phenomena described in the previous sections for one frequency applies in full for each of the other or harmonic frequencies when multi-frequency/harmonic tuners are used which allow pre-matching each said frequency component separately.

As shown in FIG. 11 the requirement for power injection (110) is reduced radically by passive pre-matching (111); in the case of a power transistor with internal impedance of 1 Ohm (112) the reduction in power requirement reaches (ideally) a factor of 12 as shown on axis (113); in reality this number can be higher if insertion losses between injection amplifiers and DUT are taken into consideration. In terms of commercial cost of associated power amplifiers the ratio is similar.

The actual combination (hybrid) impedance synthesis is shown in FIG. 12; for each of three (harmonic or not) frequencies the total reflection factors (121, 122, 123) presented to the DUT port comprise a passive reflection portion (from the tuner) (124, 125, 126) and an active portion (127, 128, 129), correspondingly; it is obvious that the active parts (127, 128, 129) are much smaller than the total vectors (121, 122, 123) and thus require much less injected power. To be able to generate this tuning mechanism a passive tuner is required, which is capable of synthesizing vectors (124, 125 and 126) independently on each-other (see ref. 2).

The present invention claims a harmonic active injection load pull setup and an operation method, in which harmonic impedance tuners create a pre-match transformation of the high reflection factor required at the output of the DUT, at the fundamental and harmonic frequencies, to the nominally 50 Ohm (reflection factor=0) of the power amplifiers used to inject power into the output of the DUT. Obvious alternative configurations of this basic concept are possible but shall not impede on the originality of the invention.

What is claimed is:

1. A test setup for power radio frequency (RF) active devices (DUT) at a multitude of frequencies (F1, F2, . . . FN), comprising:
    a harmonic receiver/network analyzer, a signal source F1 and a combo RF load;
    wherein a signal F1 from said signal source F1 is injected into an input port of said DUT and said combo RF load (reflection factor) is presented to an output port of said DUT; and
    wherein waves of the injected signal F1 and a reflected signal at the input and output port of said DUT are sampled by directional couplers and measured by said harmonic receiver/network analyzer; and
    wherein said combo RF load comprises two components:
        a) a real or passive component, created by an impedance transformer (tuner), and
        b) a virtual or active component, created by RF power injection from phase and amplitude modulated external signal sources;
    said RF power injection comprising a multitude of signal sources at the frequencies (F1, F2, . . . FN) and said impedance transformer (tuner) being able to independently tune at each of said frequencies.

2. The test setup as in claim 1, wherein said input signal F1 is at a fundamental frequency Fo and the injected signals at the output of said DUT are at multiple harmonic frequencies FN of said fundamental frequency Fo, with FN=N×Fo with N=1, 2, 3 etc.

3. The test setup as in claim 1, wherein output signal sources are synchronized (coherent) with the signal source injected at the input of said DUT.

4. The test setup as in claim 1, wherein output signal sources are synchronized (coherent) with the signal source injected at the input of said DUT.

5. The method as in claim 4, where a frequency of said input signal F1 is a fundamental frequency Fo and output signal frequencies (F2, . . . FN) are multiple harmonic frequencies N×Fo of said fundamental frequency, wherein N=2, 3 . . . etc.

6. The method as in claim 4, wherein said impedance transformer (tuner) is a multi-probe multi-frequency tuner, capable of tuning each said frequencies ("F1 . . . FN") separately and independently on each other.

7. The method as in claim 5, wherein said impedance transformer (tuner) is a multi-probe harmonic tuner, capable of tuning each harmonic frequency N×Fo independently on each other, wherein N=1, 2, 3 . . . etc.

8. The test setup as in claim 6, wherein an output of said impedance transformer (tuner) comprises a cascade of two or more wideband impedance tuners, said cascade of two or more wideband impedance tuners being capable of tuning most or all said frequencies F1 to FN independently on each-other.

9. The test setup as in claim 6, wherein an output of the impedance transformer (tuner) is an electronic tuner.

10. The test setup as in claim 6,
    wherein an output of the impedance transformer (tuner) comprises a cascade of two or more wideband electro-mechanical or electronic tuners, said cascade of two or more wideband impedance tuners being capable of tuning most or all said frequencies F1 to FN independently on each-other.

11. A tuning method for hybrid harmonic load pull test systems, said test systems comprising:
    a multitude of synchronized signal sources at frequencies FN=N×Fo (N=1, 2, 3 . . . ), a harmonic receiver, a DUT, signal samplers, multi-harmonic impedance transformer (tuner) and power amplifiers;

wherein a fundamental frequency F1=Fo is injected both into the input and output of said DUT; and wherein harmonic frequencies (F2, F3, . . . ) are injected into the output of said DUT; and wherein said impedance transformer tuner pre-matches a conjugate complex internal output impedance of said DUT to an injecting signal source at said fundamental frequency F1=Fo; and wherein said impedance transformer (tuner) synthesizes a maximum portion of a load reflection factor at harmonic frequencies (F2, F3, . . . ) as required for optimum performance of said DUT, within a transformation tuning range of said impedance transformer (tuner).

12. The test setup as in claim 1, further comprising:

an impedance synthesis method for tuning a hybrid active-passive harmonic load pull test system comprising:

an active tuning component and a passive tuning component, wherein the passive tuning component is created by direct reflection of a signal exiting from the DUT output port on a multi-probe passive impedance tuner, and wherein the active tuning component is created by signals injected by the fundamental (Fo) and harmonic (F2, F3 . . . ) signal sources into the DUT output port;

whereby said injected signals are synchronized with a signal at Fo, which is injected into the DUT input port, and wherein the impedance transformer (tuner) approximately pre-matches (tunes to the conjugate complex internal output impedance of) the DUT at the fundamental (Fo) and harmonic frequencies (F2, F3 . . . ); and wherein a phase and amplitude of the active tuning component is adjusted for highest efficiency (lowest signal injection power) and superimposed on the passive tuning component, whereby the passive tuning component is, typically, larger than the active tuning component, thus reducing the requirement for high power signal injection at (Fo, F2, F3 . . . ) into the DUT output port.

\* \* \* \* \*